United States Patent
Breu et al.

[11] Patent Number: 6,154,712
[45] Date of Patent: Nov. 28, 2000

[54] TEST PROCEDURE AND TEST STATION FOR CARRYING OUT THE TEST PROCEDURE

[75] Inventors: Johann Breu, Rattiszell; Ludwig Pirkl, Kallmünz; Thomas Wagner, Taufkirchen; Peter Wojtalla, Langenpreising; Franz Stegerer, Regensburg; Otto Voggenreiter; Leon Masseus, both of München, all of Germany; Mee-Moi Yap, Malacca, Malaysia; Walter Juri, München, Germany

[73] Assignees: Siemens Aktiengesellschaft, Munich; Hewlett Packard GmbH, Boeblingen, both of Germany

[21] Appl. No.: 09/237,167
[22] Filed: Jan. 25, 1999

Related U.S. Application Data

[63] Continuation of application No. PCT/EP97/03911, Jul. 21, 1997.

[30] Foreign Application Priority Data

Jul. 24, 1996 [DE] Germany ............ 196 29 915

[51] Int. Cl.⁷ ............ G01R 36/00; G08B 29/00
[52] U.S. Cl. ............ 702/82; 714/25
[58] Field of Search ............ 702/82, 90, 57–59; 714/25

[56] References Cited

FOREIGN PATENT DOCUMENTS

| 2694635 | 2/1994 | France . |
| 4022954A1 | 1/1992 | Germany . |

*Primary Examiner*—Kamini Shah
*Attorney, Agent, or Firm*—Herbert L. Lerner; Laurence A. Greenberg; Werner H. Stemer

[57] ABSTRACT

A test procedure or test station for testing products, especially products completed on an assembly line type production process, performing the following steps: First, testing a parameter of a product with a first testing device using a first input signal to produce a first test result. Second, testing the same parameter of the product with a second testing device using a second input signal that is independent of the first input signal to produce a second test result. Third, deriving a differential value from the test results obtained by the testing devices. Fourth, determining the conformance of the testing station from the differential value and outputting an error message when the differential value deviates from a predetermined range. Fifth, repeating above steps for at least one other parameter.

10 Claims, 4 Drawing Sheets

TEST PROCEDURE AND TEST STATION FOR CARRYING OUT THE TEST PROCEDURE

CROSS-REFERENCE TO RELATED APPLICATION

This is a continuation of copending International Application PCT/EP97/03911, filed Jul. 21, 1997 now EP914617A1, which designated the United States.

BACKGROUND OF THE INVENTION

FIELD OF THE INVENTION

The present invention relates to a test procedure for carrying out a series of measurements on a large number of identical products after they have been manufactured, as well as to a test station for carrying out the test procedure.

When products have been manufactured, in particular semiconductor products, the quality of the final product must be checked continuously in order to ensure a high product quality standard. In this case, the accuracy and the reliability of the test apparatus plays a major role. In order to identify various discrepancies in the test apparatus early, the test apparatuses are checked at specific time intervals using previously characterized reference products.

Such diagnostic procedures and calibration routines are generally carried out by hand. This not only takes an extremely long time, but is also linked to high costs, since the test apparatus cannot be used productively during the diagnostic or calibration process. In consequence, some insidious discrepancies are frequently identified too late, which can lead to costly reworking and testing of the products.

Since every individual measurement is also subject to errors, specific measurement tolerances must also be introduced during the development of the test routines. The manufacturer's details relating to the test equipment are normally taken into account in this case. These details are generally not checked, or are too complex, and this is generally inconsistent with guaranteeing that the manufactured products have a high standard of quality (fault rate<1 ppm).

SUMMARY OF THE INVENTION

It is accordingly an object of the invention to provide a test procedure and a test station for carrying out the test procedure which overcome the above-mentioned disadvantages of the prior art methods and devices of this general type.

With the foregoing and other objects in view there is provided, in accordance with the invention, a test procedure for carrying out a series of measurements on a large number of identical products after they have been manufactured, which includes: a) testing a parameter of a product under test with a first test apparatus using a first input signal for producing a first test result; b) testing the parameter of the product under test with a second test apparatus using a second input signal independent of the first input signal for producing a second test result independent of the first test result; c) calculating a value of a difference between the first test result and the second test result; d) evaluating statistically and with the aid of a computer the first test result, the second test result and the value of the difference with earlier determined data determined in an identical series of measurements on products tested earlier; e) outputting a fault message if the value of the difference is outside a tolerance interval; and f) repeating steps a) and e) for at least one other parameter.

The object of the present invention is thus to specify a test procedure and a test station for carrying out a series of measurements on a large number of identical products after they have been manufactured. The aim with the test procedure and test station according to the invention is to allow semiconductor components to be tested correctly taking account of system-dependent measurement errors, as well as to carry out a stability check of the test apparatus required for this purpose.

The procedure according to the invention, in the case of a test system linked to a production line, allows a discrepancy in the test system to be identified early during production, that is to say during operation of the production line.

The test result determined by the test apparatuses is compared with the previously defined upper and lower test limits, by which product faults are identified, and faulty products can thus be filtered out correctly, taking account of test equipment errors. In order to filter out any discrepancy in accuracy or reliability present in the test apparatus, a further test result is determined in the same test apparatus using current sources or voltage sources and test paths that are different than those used for the first test.

Since present-day test apparatuses are equipped with a number of identical current sources or voltage sources, the procedure can be used universally and without any additional cost.

In a development, the second test process is carried out by the second reference test apparatus, only on one sample. It is thus possible to assume with high probability that, for example, a "critical" or "insidious" discrepancy in one of the test apparatuses will be identified early. The size of the sample can be varied or adapted automatically, for example by software control, based on the discrepancies found by the procedure according to the invention.

In a development, automatic recalibration of the test apparatus can also be carried out by the status values of the test apparatus determined by the procedure according to the invention.

Other features which are considered as characteristic for the invention are set forth in the appended claims.

Although the invention is illustrated and described herein as embodied in a test procedure and a test station for carrying out the test procedure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
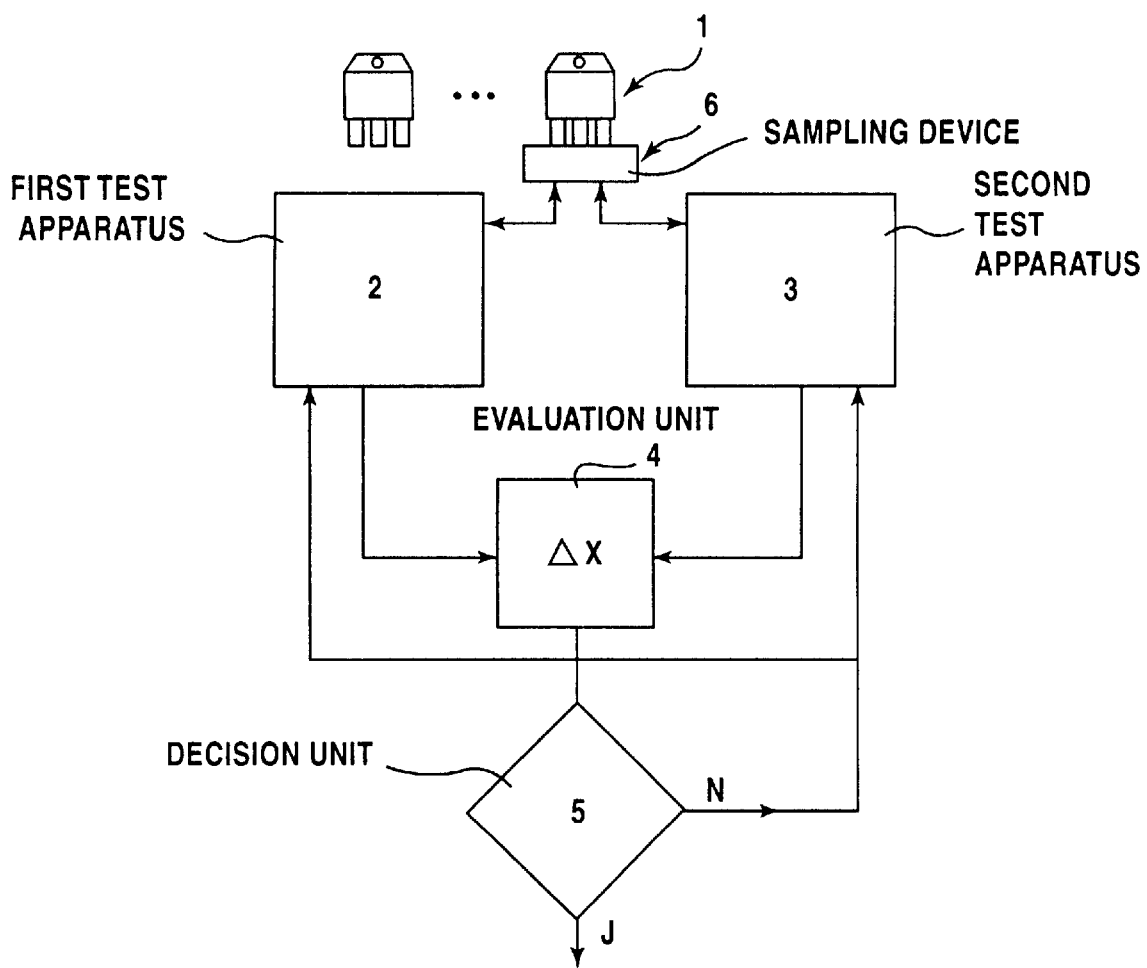
FIG. 1 is a diagrammatic block circuit diagram of a basic configuration of a test station according to the invention.

In all the figures of the drawing, sub-features and integral parts that correspond to one another bear the same reference symbol in each case. Referring now to the figures of the drawing in detail and first, particularly, to FIG. 1 thereof, there is shown a power semiconductor 1 which is to be tested and is connected via an appropriate non-illustrated supply device and via a sampling device 6 to a first test apparatus 2. Any other desired products whose characteristics are intended to be tested on the basis of one or more parameters can, of course, be used here.

A first test apparatus 2 determines a first parameter, after which the power semiconductor 1 which is to be tested is connected to a second test apparatus 3, for example a reference, by a changeover device of the sampling device 6. The second test apparatus 3 determines the same parameter, for example using a second test source that is identical to the first, and transmits the test result to an evaluation unit 4. The test results determined by the two test apparatuses 2, 3 are subtracted from one another in the evaluation unit 4 and the value of a difference δ determined in this way is passed to a decision unit 5.

The decision unit 5 produces control signals, for example a signal N, causing a diagnosis or a recalibration process of the test apparatuses 2, 3, or produces a clearance signal J, if a predetermined critical value is not violated. A computation unit, which is not illustrated in any more detail, can evaluate all the gathered data statistically and initiate the diagnosis/recalibration mentioned above just on the basis of the specific statistical values.

The entire test procedure takes place as follows. The completed product, in the present case the power semiconductor 1, is electrically connected to the first test apparatus 2 of a test station. The test apparatus 2 has a first test source which, for example in the case of a semiconductor, may be a current source which can be used to determine the forward resistance. The test station has the second test apparatus 3, of identical construction, as a reference which, in the illustrated example, is likewise a current source, in which case this current source is once again independent of the first current source. The corresponding paths to the module may likewise be duplicated.

Instead of the two test apparatuses 2, 3, a single test apparatus having two current sources that may be connected as alternatives can also be provided. In order to use the procedure according to the invention for early identification of fault sources which can occur within the test apparatuses 2, 3 it makes sense to provide two identical test apparatuses 2, 3, which are separate from one another, with the respective cable paths, changeover relays, etc. In the illustrated example, the forward resistance is now determined in two runs, separately from one another, by the two test apparatuses 2, 3. The evaluation unit 4 then determines the value of the difference δ between the tested parameters. In the present example, this is the forward resistance. Instead of using a current source as a reference, it is, of course, also feasible to use a voltage source or the like for this purpose.

Normally, that is to say when the test station is in the ideal state, both of the test apparatuses 2, 3 determine exactly the same forward resistance, as a result of which the evaluation unit 4 determines a difference value δ=0. If the test station has been in use for a relatively long time, it is possible that the nominal output range of one of the test sources may fluctuate, for example owing to temperature fluctuations, usage or the like. However, from experience, the two test apparatuses 2, 3 do not drift in the same direction. The value of a difference d can thus be used to determine quickly whether the test apparatuses 2, 3 are still operating within a predetermined tolerance band. If the determined value of the difference δ is outside the predetermined tolerance band, then the decision unit 5 outputs a fault signal N. If the determined value of the difference d is within the predetermined tolerance band, then the decision unit outputs a clearance signal J.

In order to avoid an identical fault occurring in both of the test apparatuses 2, 3, only the first test apparatus 2 is fed with all the components to be tested. The second test apparatus 3 then receives only a selected sample, that is to say, for example, every tenth component is tested. This provides greater confidence of avoiding an identical malfunction in the test apparatuses 2, 3 owing to usage, temperature influences or the like.

Figure 2:
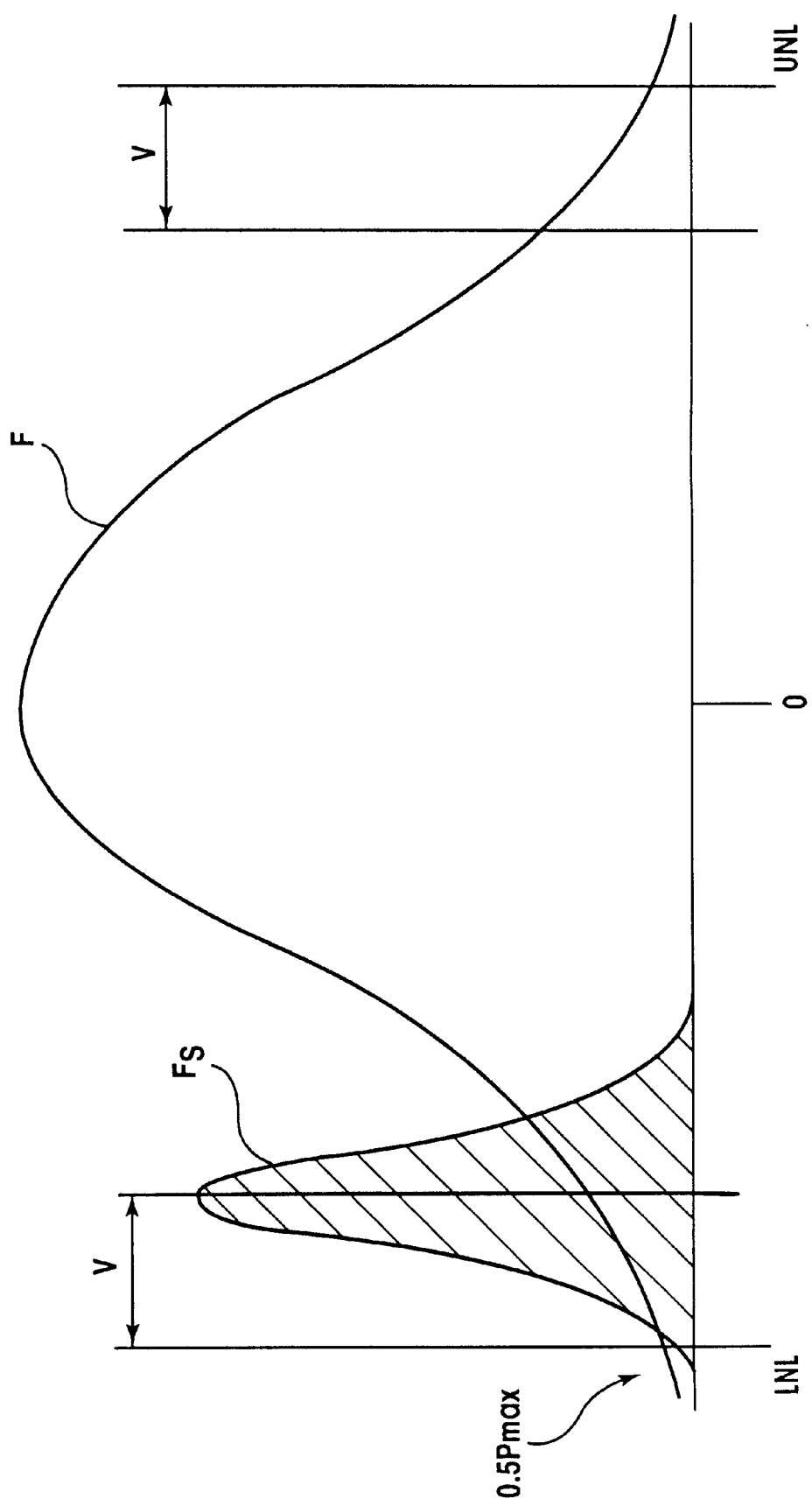
FIG. 2 is a graph of calculations of upper and lower nominal limits, which also show measurement tolerances.

FIG. 2 is a graph showing a typical normal distribution of the discrepancies in the values of the difference from the test results. In addition, FIG. 2 shows the calculation of the upper and lower nominal limits, with the corresponding measurement tolerances.

In this case, F indicates a distribution of parameters of the measured value from the two test results. F is a measure of a product scatter in this case. The distribution F is disposed symmetrically about zero in the present example. However, this is not necessarily the case. Appropriate limits are shown as the critical limit for the decision unit 5, in which case LNL denotes the lower nominal limit and UNL denotes the upper nominal limit.

During the product test, it is necessary to check whether the values $X_i$ measured in the test apparatuses 2, 3 satisfy the rule, that is to say:

$$LNL \leq X_i \leq UNL$$

However, since every measurement is also subject to errors, it is necessary to introduce certain measurement tolerances V. Manufacturer's details relating to the test equipment are normally taken into account for this purpose. The procedure according to the invention takes account of the distribution F, determined from the measured values, of the test procedure and of the quality aims in the statistical determination of the measurement tolerances. The distribution F of the test procedure is also referred to in the following text as the capability of the test procedure. In this case, it is necessary to check whether the following condition is satisfied:

$$LNL+V \leq X_i \leq UNL-V$$

If the measurement error $X_i$ has a normal distribution and the quality aim is for a maximum error element $P_{max}$ (for example 1 ppm) or else a proportion exceeding a limit, then the measurement tolerance V results from the quantile of the standard normal distribution:

$$V = \sigma_{M'} |\Phi^{-1}(0.5 \cdot P_{max})|$$

FIG. 2 therefore shows another distribution $F_\delta$, which indicates the scatter of the measurement process of the test apparatuses 2, 3. The measurement tolerance V can be determined from the scatter of the measurement process $F_\delta$.

$\sigma_M$ is obtained from special test equipment investigations or from the Delta control card, and is calculated from the standard deviation.

If a Delta control card is used for stability monitoring, the test result determined by the test apparatus is now compared with the test limits LNL+V and UNL−V defined in advance, by which product faults can be identified, and faulty products can thus be filtered out correctly, taking account of the test equipment errors. At this stage, it is not known whether there is a reliability or accuracy discrepancy in the test apparatuses. For this reason, a further test result is determined with the same test apparatus using current sources or voltage sources and test paths that are different than those for the first test. A fault in the product or a discrepancy in the test apparatus can then be clearly identified by comparing the two test results.

Since present-day test apparatuses 2, 3 are equipped with a number of identical electrical voltage sources, the procedure can be used universally and without any additional cost.

The test apparatuses 2, 3 may have appropriate automatic calibration devices, which are activated by the signal N from the decision unit 5. Alternatively, the signal N from the decision unit 5 can also be activated when, for example, a specific number of fault messages have occurred, that is to say difference values δ which are above the test limit UNL+V or below the test limit LNL−V. The downstream statistical evaluation apparatus 4 may be, for example, a microprocessor. Such a calibration process can be activated, for example, after a number $n \geq 1$.

Figure 3:
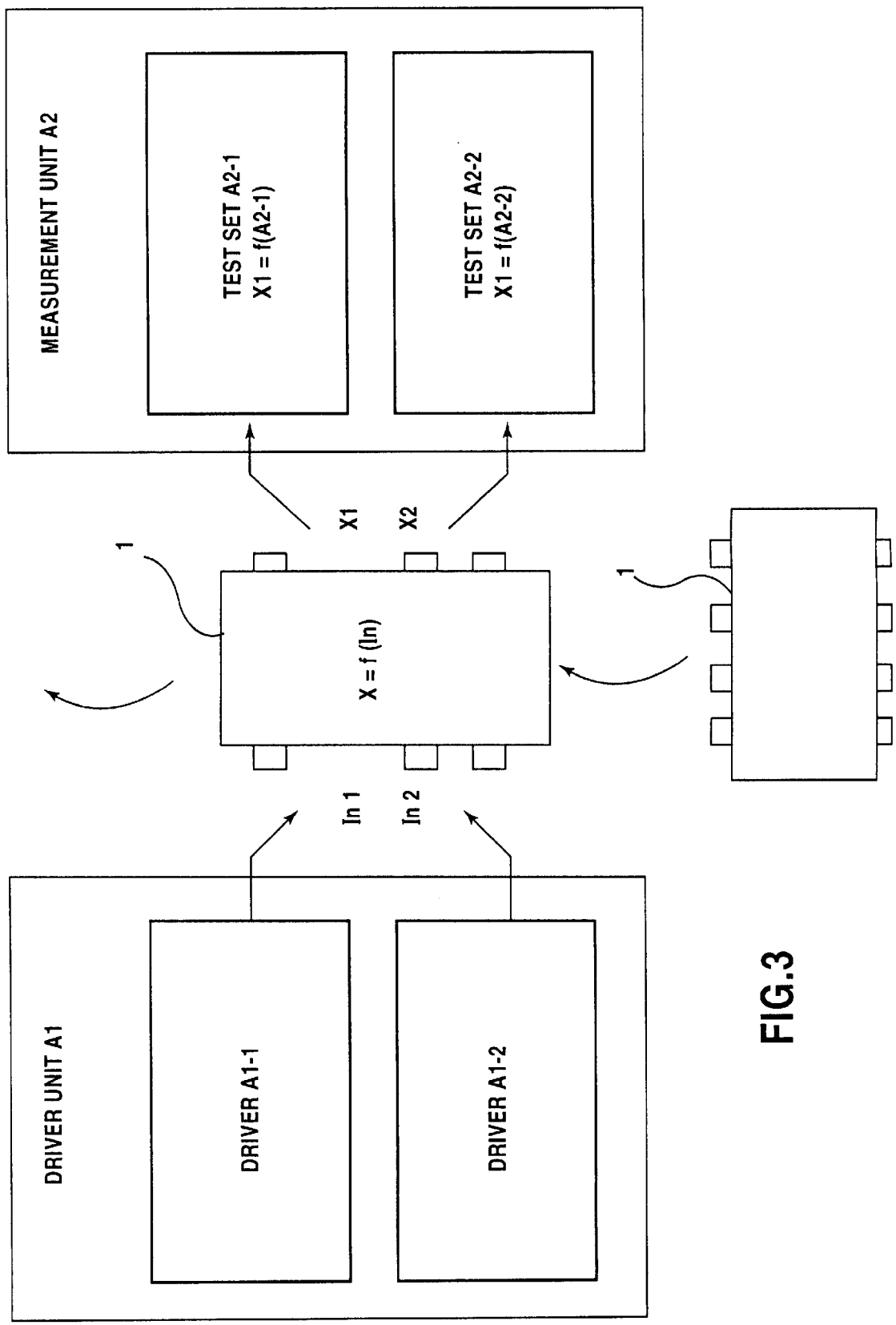
FIG. 3 is a block diagram of the basic configuration of the test station.

FIG. 3 shows a detailed block diagram of the basic configuration of a test station according to the invention. Identical and functionally identical elements are provided with the same reference symbols as in FIG. 1.

FIG. 3 shows the semiconductor component 1 which is to be tested and is connected to the test station via an appropriate non-illustrated supply device and via a non-illustrated sampling device. Any other desired products whose characteristics are intended to be tested on the basis of one or more parameters can, of course, be used here instead of the semiconductor component 1.

The test station includes a driver unit A1 and a measurement unit A2. The driver unit A1 includes two drivers A1-1, A1-2. The measurement unit A2 includes two test sets A2-1, A2-2. The driver unit A1-1 and the test set A2-1 in this case form the first test apparatus 2 mentioned initially. The driver unit A1-2 and the test set A2-2 form the second test apparatus 3. It would also be feasible to use more than two drivers, with the same number of test sets.

The semiconductor component 1 is initialized via the driver A1-1, outputting a first input signal In1. A first output signal X1 is produced at the output of the semiconductor component, and is read out via the appropriate test set A2-1, and is declared a test result X1. The second driver A1-2 of the driver unit A1 outputs a second input signal In2 to initialize the semiconductor component 1 in an analogous manner to the first driver A1-1, and in this way produces a test result X2 that is read out via the second test set A2-2 of the measurement unit A2.

An essential feature of the invention here is that the injected input signals In1, In2 are independent of one another. Two mutually independent output signals, X1, X2 can thus be output as the measurement signals.

The test process can be repeated by a changeover routine. In this way, other parameters can also be tested by appropriate measurements on other connections of the semiconductor component 1.

Figure 4:
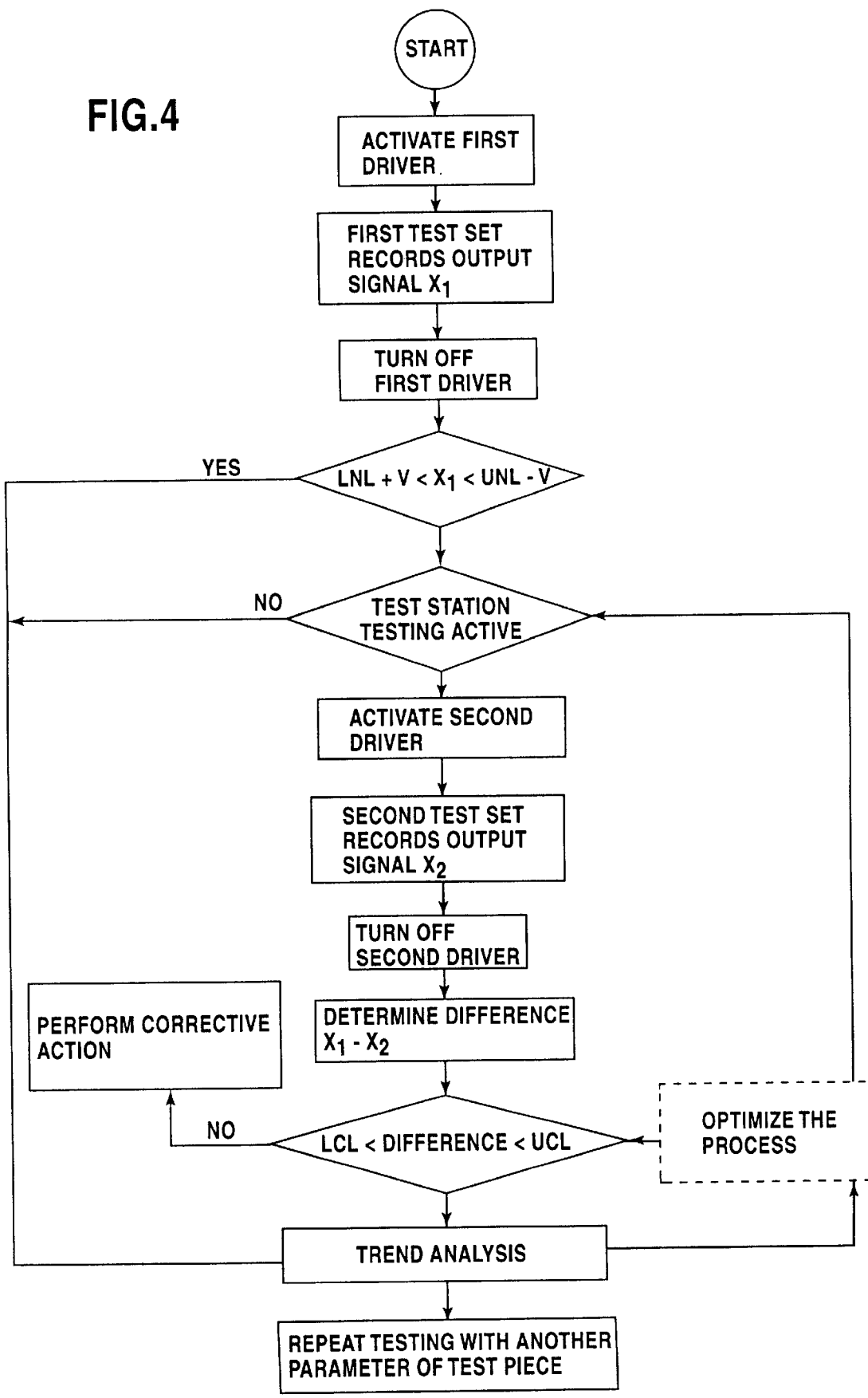
FIG. 4 is a flowchart for a test procedure in the test station.

FIG. 4 shows the flowchart in the test station according to the invention and corresponding to FIG. 3. The driver A1-2 as well as the test set A2-2 are used for this purpose in the flowchart in FIG. 4.

The test results determined by the two test sets are subtracted from one another. The value of the difference $\delta = X1 - X2$ determined in this way is checked against critical control limits including lower control limits LCL, and upper control limits UCL via a decision routine.

If the control limits LCL, UCL are undershot or exceeded, it is reported to the system, and defined correction actions are initiated.

This can, for example, result in a diagnosis or a recalibration of the driver unit A1 and of the measurement unit A2, or may result in the product test being continued. A computer unit, which is not illustrated, can evaluate the gathered data statistically (stability monitoring by Delta control cards), and can initiate the diagnosis or recalibration mentioned above only on the basis of specific statistical values.

A sequence of k measurements is required to produce the statistical control limits:

$$\delta_1 = X_{11} - X_{21}; \delta_2 = X_{12} - X_{22}; \ldots ; \delta_k$$

In this case $\delta_x = X_{1x} - X_{2x}$ (where x=1 to k) is the value of the difference between the two measurements. δ denotes both the random variable with the distribution function $F_\delta$ and its implementation.

In the case of a normal distribution:

$$\delta \sim N(\mu_\delta; \sigma_\delta),$$

while the parameters $\mu_\delta$ and $\epsilon_\delta$ respectively correspond to the arithmetic mean and the standard deviation, and are estimated.

In addition to the capability of the measurement procedure it is also possible to monitor the stability of the test procedure on-line.

This test procedure is no longer stable if at least one of the following criteria is satisfied. In practice, it is necessary to check on a case-by-case basis which criteria are applicable.

a) The system is unstable if the value of the difference δ is less than a lower control limit LCL or is greater than an upper control limit UCL, that is to say δ is less than LCL or δ is greater than UCL.

The control limits LCL and UCL are defined by the inverse distribution function $F_\delta$, which is a function of the error probability α. The control limits LCL and UCL, respectively, are defined by:

$$LCL = F_\delta^{-1}(\alpha/2)$$

$$UCL = F_\delta^{-1}(1-\alpha/2)$$

b) The system is unstable if m successive difference values δ occur on one side of the center line, even if there is no value beyond the control limits LCL, UCL (so-called RUN). In this case, m can be defined from:

$$2 * 0.5^m \leq \alpha$$

c) The system is unstable if a trend is present. There are two alternative possibilities here:

First, m successive difference values δ rise or fall continuously. m is then given by:

$$2 \cdot \frac{1}{m!} \leq \alpha$$

Second, the linear regression line defined by m successive points is determined and is checked to see whether the gradients differ significantly from 0 (statistical test).

If one of the above-mentioned conditions is satisfied, a sequence of corrective measures can be initiated, such as calibration or diagnosis of the test system, which is initiated automatically by the test system.

The procedure according to the invention is carried out for all the parameters to be tested. The test station must therefore be configured to be duplicated for each parameter to be tested. The following characteristic values Ckg, Cg, which may be calculated, can be used to determine the statistical values which are critical to the quality of the test apparatuses 2, 3. The two characteristic values Cg and Cgk represent the capability of the overall test station.

Let us assume that $\chi=1-\chi$ with different $\delta_1=X_{11}-X_{21}$; $\delta_2=X_{12}-X_{22}$; ... ; $\delta_\chi$ in a batch or reporting time period. This is used to determine the distribution function $F_\delta$. The two following characteristics for the capability (gauge capability) Cg and Cgk can be determined from this:

$$C_g = \frac{\Delta \cdot (UCL - LCL)}{F_\delta^{-1}(1-\alpha/2) - F_\delta^{-1}(\alpha/2)}$$

$$C_{gk} = \operatorname{minimum}(C_{go}, C_{gu})$$

where $\Delta=0.25$ and $\alpha=0.0027$. Cgo and Cgu are given by $$C_{go} = \left( \frac{((UCL+LCL)/2) + (\Delta/2)(UCL/LCL) + F_\delta^{-1}(0.5)}{F_\delta^{-1}(1-\alpha/2) - F_\delta^{-1}(0.5)} \right)$$

and $$C_{gu} = \left( \frac{F_\delta^{-1}(0.5) - (((UCL+LCL)/2) - (\Delta/2)(UCL-LCL))}{F_\delta^{-1}(0.5) - F_\delta^{-1}(\alpha/2)} \right)$$

The capability values must in this case satisfy the quality aims of the corresponding process capability values Cg and Cgk.

The test procedure according to the invention is due to determine the nominal limits, so that the proportion of faulty components which are found to be good and are delivered on the basis of the test accuracy does not exceed a predetermined quality aim.

Conventional methods, such as calibrating a test system at specific time intervals, give an indication of the test equipment capability at only one point in time. This never makes it possible to preclude the tester operating outside the specific range between these time intervals. Repeated testing of products tested provisionally as scrap is likewise prevented by the procedure according to the invention, as is the delivery of faulty components which, under some circumstances, were classified as being serviceable within the system-dependent measurement error. The quality aims can thus be guaranteed, and costly remeasurement and recall actions can be prevented from the start. The test times are also shortened, and the test costs are reduced. Furthermore, the test capacity of the test system is considerably increased.

We claim:

1. A test procedure for carrying out a series of measurements on a large number of identical products after they have been manufactured, which comprises:
    a) testing a parameter of a product under test with a first test apparatus using a first input signal for producing a first test result;
    b) testing the parameter of the product under test with a second test apparatus using a second input signal independent of the first input signal for producing a second test result independent of the first test result;
    c) calculating a value of a difference between the first test result and the second test result;
    d) evaluating statistically and with the aid of a computer the first test result, the second test result and the value of the difference with earlier determined data determined in an identical series of measurements on earlier tested products;
    e) outputting a fault message if the value of the difference is outside a tolerance interval; and
    f) repeating steps a) and e) for at least one other parameter.

2. The test procedure according to claim 1, which comprises outputting the fault message if a quality of one of the first test apparatus and the second test apparatus is outside a further tolerance interval.

3. The test procedure according to claim 1, which comprises carrying out step a) for all products to be tested, and carrying out step b) for every n-th product to be tested, where n is equal to or less than a total number of products to be tested.

4. The test procedure according to claim 1, which comprises carrying out at least one of a diagnosis and a recalibration after a predetermined number of m fault messages have been output and the predetermined number $m \geq 1$.

5. A test station, comprising:
    a first current source outputting a first input signal to be received by a product under test;
    a second current source outputting a second input signal independent of the first input signal and to be received by the product under test;
    a computer-aided evaluation unit connected to and controlling said first current source and said second current source, said computer-aided evaluation unit being programmed to:
    a) test a parameter of the product under test by providing the first input signal to the product under test for producing a first test result;
    b) test the parameter of the product under test by providing the second input signal to the product under test for producing a second test result independent of the first test result;
    c) calculate a value of a difference between the first test result and the second test result;
    d) evaluate statistically the first test result, the second test result and the value of the difference with earlier determined data determined in an identical series of measurements on products tested earlier;
    e) determine a distribution of the values of the difference to produce a statistical analysis of a measurement error distribution;
    f) output a fault message if the value of the difference is outside a tolerance interval; and
    g) repeat steps a) and f) for at least one other parameter.

6. The test station according to claim 5, wherein said first current source is part of a first test apparatus and said second current source is part of a second test apparatus that is identical to said first test apparatus.

7. The test station according to claim 5, wherein said first current source and said second current source are part of a single test apparatus, said single test apparatus having a first testing unit and a second testing unit that are susceptible to faults, said first testing unit activated during a first test process and said second testing unit activated during a second test process.

8. The test station according to claim 5, wherein said computer-aided evaluation unit has means for defining a tolerance intervals.

9. The test apparatus according to claim 8, wherein the tolerance intervals are defined from an analysis of the statistical measurement error distribution.

10. A test station, comprising:

a first voltage source outputting a first input signal to be received by a product under tests;

a second voltage source outputting a second input signal independent of the first input signal and to be received by the product under test;

a computer-aided evaluation unit connected to and controlling said first voltage source and said second voltage source, said computer-aided evaluation unit being programmed to:

a) test a parameter of the product under test by providing the first input signal to the product under test for producing a first test result;

b) test the parameter of the product under test by providing the second input signal to the product under test (1) for producing a second test result independent of the first test result;

c) calculate a value of a difference between the first test result and the second test result;

d) evaluate statistically the first test result, the second test result and the value of the difference with earlier determined data determined in an identical series of measurements on products tested earlier;

e) determine a distribution of the values of the difference to produce a statistical analysis of a measurement error distribution;

f) output a fault message if the value of the difference is outside a tolerance interval; and g) repeat steps a) and f) for at least one other parameter.

* * * * *

UNITED STATES PATENT AND TRADEMARK OFFICE
Certificate

Patent No. 6,154,712                                                  Patented: November 28, 2000

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Johann Breu, Rattiszell, Germany; Ludwig Pirkl, Kallmünz, Germany; Thomas Wagner, Taufkirchen, Germany; Peter Wojtalla, Langenpreising, Germany; Franz Stegerer, Regensburg, Germany; Otto Voggenreiter, München, Germany; Leon Masseus, München, Germany; Mee-Moi Yap, Malacca, Malaysia; Walter Juri, München, Germany; Fred Lane, Ceres, CA; Tsun Stephen, Newark, CA; Gary Kinoshita, Santa Clara, CA; Rainer Schroder, Schlieren, Switzerland; and Werner Kornmayer, Vienna, Austria.

Signed and Sealed this Third Day of August 2004.

JOHN BARLOW
*Supervisory Patent Examiner*
*Art Unit 2863*